United States Patent [19]

Kozaka et al.

[11] Patent Number: 5,081,509
[45] Date of Patent: Jan. 14, 1992

[54] SEMICONDUCTOR RECTIFYING DIODE WITH PN GEOMETRY

[75] Inventors: Hiroshi Kozaka, Hitachi; Susumu Murakami, Katsuta; Masanori Takata, Hatachi; Takao Yaginuma, Hitachiota; Naofumi Kohno, Hadano, all of Japan

[73] Assignee: Hitachi, Ltd., Tokyo, Japan

[21] Appl. No.: 580,534

[22] Filed: Sep. 11, 1990

[30] Foreign Application Priority Data

Sep. 20, 1989 [JP] Japan .................. 01-242035

[51] Int. Cl.[5] ............................ H01L 29/90
[52] U.S. Cl. ....................... 357/13; 357/15; 357/38; 357/55
[58] Field of Search ............ 357/13, 15, 22, 38, 357/55, 58

[56] References Cited

U.S. PATENT DOCUMENTS 4,862,229  8/1989  Mundy et al. .................. 357/15

*Primary Examiner*—William Mintel
*Assistant Examiner*—Roy Potter
*Attorney, Agent, or Firm*—Antonelli, Terry, Stout & Kraus

[57] ABSTRACT

A semiconductor rectifying diode includes a first semiconductor region of one conductivity type, a plurality of third semiconductor regions of the other conductivity type provided on one surface of said first semiconductor region to be spaced a distance W, and a main electrode provided on said one main surface in ohmic contact with said first semiconductor region and in contact with said third semiconductor regions through the Schottky barrier. To reduce reverse leakage current a relation of $2w_o < W \leq 3D$ is satisfied, where D is the depth of said third semiconductor regions and $w_o$ is the width of a depletion layer spread to said first semiconductor region by a diffusion potential of the pn junction formed between said first semiconductor region and said third semiconductor region.

10 Claims, 10 Drawing Sheets

SEMICONDUCTOR RECTIFYING DIODE WITH PN GEOMETRY

BACKGROUND OF THE INVENTION

This invention relates to semiconductor devices, and particularly to a low-loss diode having a low forward voltage drop and a small reverse leakage current.

The semiconductor rectifying diode is a circuit element for converting AC to DC, and a large number of such diodes are used for electrical equipment powered by DC or for the power supply for electronic equipment. Recently, since most electrical and electronic equipment is now formed by semiconductors, ICs and further LSIs which save energy, the power consumption in the power supply is becoming an important factor which governs the efficiency of the equipment. In order to reduce the power consumption in the power supply, it is necessary to decrease the loss in the semiconductor rectifying diodes which are chief components of the power supply. As one of the methods of decreasing the loss in the semiconductor rectifying diodes, it is known to use the Schottky junction diode in place of the pn junction diode. The Schottky junction diode has a forward voltage drop of as low as 0.5 to 0.6 v, and thus has a low forward loss, but its reverse leakage current is two figures larger than that of the pn junction diode, so that the reverse loss is increased. The total loss of the forward and reverse losses of the Schottky junction diode is only slightly lower than that of the pn junction diode. Thus, the structure of the Schottky junction diode has been improved to decrease the reverse leakage current as disclosed in Japanese Patent Publication Gazette No. 35183/1984, and Japanese Patent Laid-open Gazettes No. 2672/1981, No. 115566/1984 and No. 74582/1985. In these gazettes, semiconductor regions of the opposite conductivity to that of the substrate region are formed to be adjacent to the Schottky junction and to be arranged in parallel with a predetermined spacing so that when a reverse voltage is applied, the pn junction between the semiconductor region and the substrate region is reverse biased. Thus, the semiconductor regions are mutually pinched off by the depletion layer spread to the substrate region.

In the Schottky junction diode of the structure in which the current path of the reverse leakage current is pinched off by the depletion layer, it is difficult to reduce the reverse leakage current for the reason which will be described later. Thus, use of the known semiconductor rectifying diodes in the power supply of electric and electronic equipment will increase the loss in the power supply and hence in the equipment. Moreover, a large loss in the power supply results in generation of much heat in the power supply, so that large cooling arrangements become necessary. This prevents the equipment from being small-sized.

SUMMARY OF THE INVENTION

Accordingly, it is an object of the invention to provide a semiconductor rectifying diode with the above defects obviated, or concretely to provide a low-loss semiconductor rectifying diode.

According to this invention, there is provided a semiconductor rectifying diode having a semiconductor substrate having with a pair of main surfaces, a first semiconductor region of one conductivity type provided between the pair of main surfaces and adjacent to one main surface of the pair of main surfaces, and a second semiconductor region of the one conductivity type provided adjacent to the other main surface and to the first semiconductor region. The second semiconductor region has a higher impurity concentration than the first semiconductor region. A plurality of third semiconductor regions of the other conductivity type are provided to extend from the one main surface into the first semiconductor region and to be spaced a predetermined distance apart from one another as viewed from the one main surface side. A first main electrode is provided on the one main surface of the semiconductor substrate to form Schottky junctions with the surface of the first semiconductor region and to be in ohmic contact with the third semiconductor regions. A second main electrode is provided on the other main surface of the semiconductor substrate to be in ohmic contact with the second semiconductor region. In accordance with the invention a relation of $2w_o < W \leq 3D$ is satisfied, where W is the distance between the third semiconductor regions, D is the depth thereof, and $w_o$ is the width of a depletion layer spread to the first semiconductor region side by a diffusion potential of a pn junction formed between the first semiconductor region and the third semiconductor regions. The plurality of third semiconductor regions may take a stripe shape, polygonal shape, mutually connected stripe shape or polygonal shape or modifications thereof. The first main electrode can be made of a single metal or a plurality of metals with different barrier heights in the interface between the first main electrode and the first semiconductor region.

The reverse leakage current density $J_R$ in the Schottky junction can be expressed by the following equation (1):

$$J_R = A^* \cdot T^2 \cdot \exp\left[ -\frac{q}{k_B \cdot T} \left( \psi_{B0} - \sqrt{\frac{q}{4\pi\epsilon_{Si}} \cdot E_x^{\frac{1}{2}}} - \alpha \cdot E_m \right) \right] \quad (1)$$

where $A^*$ is the Richardson constant, T is the absolute temperature (K), q is the magnitude of electronic charge, $k_B$ is Boltzmann's constant, $\psi_{B0}$ is the barrier height (V), $\epsilon_{Si}$ is the dielectric constant of the semiconductor, $E_m$ is the surface electric field strength on the semiconductor side of the Schottky junction, and $\alpha$ is an empirically given parameter. From the parenthesized term of Eq. (1), it will be understood that as the electric field strength $E_m$ increases, the value of the parenthesized term, or the barrier height is reduced and thus the reverse leak current expressed by Eq. (1) increases.

Since the semiconductor rectifying diode of this invention is constructed to satisfy the relation of $2w_o < W \leq 3D$ where W is the distance between the third semiconductor regions, or the width of the Schottky junction, D is the depth of the third semiconductor regions, and $w_o$ is the width of the depletion layer spread to the first semiconductor region side by the diffusion potential of the pn junction formed between the first semiconductor region and the third semiconductor regions, the surface electric field strength on the semiconductor side of the Schottky junction is greatly reduced and thus the reverse leakage current is considerably decreased, resulting in low loss.

DESCRIPTION OF THE PREFERRED EMBODIMENTS

One embodiment of the invention will be described in detail with reference to drawings.

Figure 1:
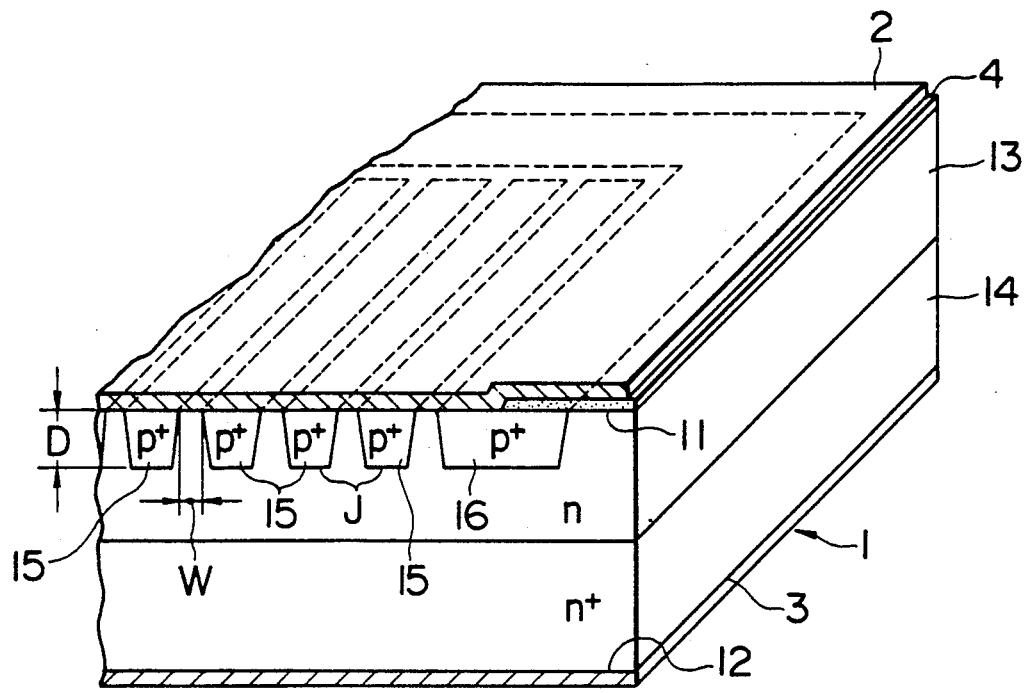
FIG. 1 is a perspective view of one embodiment of a semiconductor rectifying diode of this invention.

FIG. 1 is a perspective view of a main part of one embodiment of a semiconductor rectifying diode of the invention. Referring to FIG. 1, there is shown a semiconductor substrate 1 having a pair of main opposite surfaces 11 and 12. This substrate has provided between the pair of main surfaces a first semiconductor region 13 of n-type adjacent to the one main surface 11, and a second semiconductor region 14 of n+-type adjacent to the other main surface 12 and to the first semiconductor region 13. The second region 14 has a higher impurity concentration than the first semiconductor region 13. A plurality of third semiconductor regions 15 of p+-type extend from the one main surface 11 into the first semiconductor region 13, and are formed parallel in a stripe pattern with a spacing as viewed from the one main surface 11 side. The third regions 15 have a higher impurity concentration than the first semiconductor region 13. The device also includes a fourth semiconductor region 16 of p+-type which extends from the one main surface 11 into the first semiconductor region 13, which is of a ring shape surrounding the group of the third semiconductor regions 15 with a certain distance therefrom as viewed from the one main surface 11 side, and which has a higher impurity concentration than the first semiconductor region 13. Shown at 2 is a first electrode which is provided on the one main surface 11 of the semiconductor substrate 1, which forms a Schottky junction in the interface between it and the first semiconductor region 13, and which makes ohmic contacts with the inner peripheral sides of the third semiconductor regions 15 and the fourth semiconductor region 16. Shown at 3 is a second electrode which is in ohmic contact with the second semiconductor region 14 on the other main surface 12 of the semiconductor substrate 1. Shown at 4 is an insulating film of $SiO_2$, PSG or the like which is provided on the outer peripheral side portion of the fourth semiconductor region 16 and the first semiconductor region 13 exposed along the outer periphery thereof on the peripheral edge of the one main surface 11 of the semiconductor substrate 1. Part of the first main electrode 2 extends to lie on the insulating film 4. The first main electrode 2 is made of an electrode material for making a barrier to the electrons as a majority carrier of the first semiconductor region 13, for example, a metal such as Mo or Ti, a silicide thereof and a polycrystalline silicon or amorphous silicon including a metal (Be) or other impurities (Ge, B).

The important point in this embodiment is that the third semiconductor regions 15 are formed to satisfy the condition of $2w_o < W \leq 3D$ where W is the distance between the third semiconductor regions 15, D is the depth of the third semiconductor regions 15, and $w_o$ is the width of the depletion layer spread to the first semiconductor region 13 side by the diffusion potential of the pn junction J formed between the first semiconductor region 13 and the third semiconductor regions 15. The reason for this will be described below.

Figure 2A:
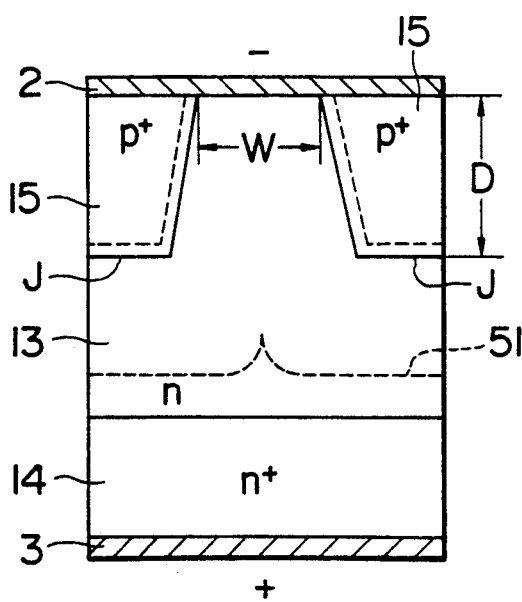
FIG. 2A and 2B show a partially magnified cross-sectional diagram useful for the explanation of the action of the diode shown in FIG. 1.
Figure 2B:
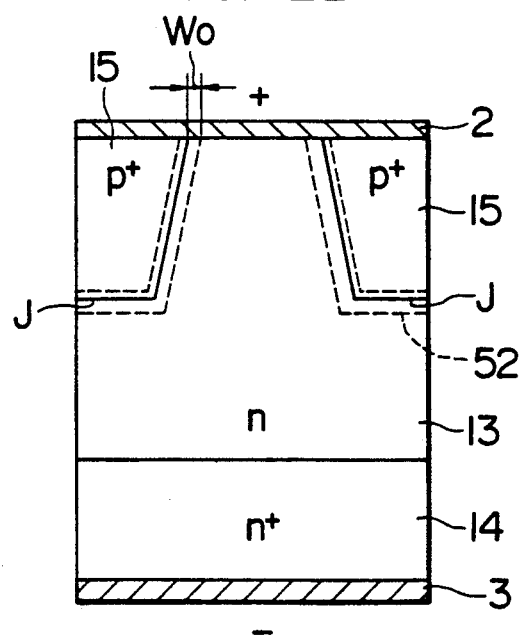

FIG. 2A and 2B are partially magnified sectional views of the semiconductor rectifying diode of FIG. 1. FIG. 2(A) shows the reverse biased condition in which the second main electrode 3 is at a positive potential and the first main electrode 2 is at a negative potential, and FIG. 2(B) shows the forward biased condition in which the first main electrode 2 is at a positive potential and the second main electrode 3 is at a negative potential. In the reverse biased condition shown in FIG. 2(A), the depletion layer extending from the pn junction J into the first semiconductor region 13 fully occupies the space between the first semiconductor regions 15 and extends to near the second semiconductor region 14 as indicated by a broken line 51. At this time, the reverse leakage current flows partially through the pn junction and dominantly through the Schottky junction. The reverse leakage current flowing through the Schottky junction greatly depends on the electric field strength at this portion as described above.

Figure 3A:
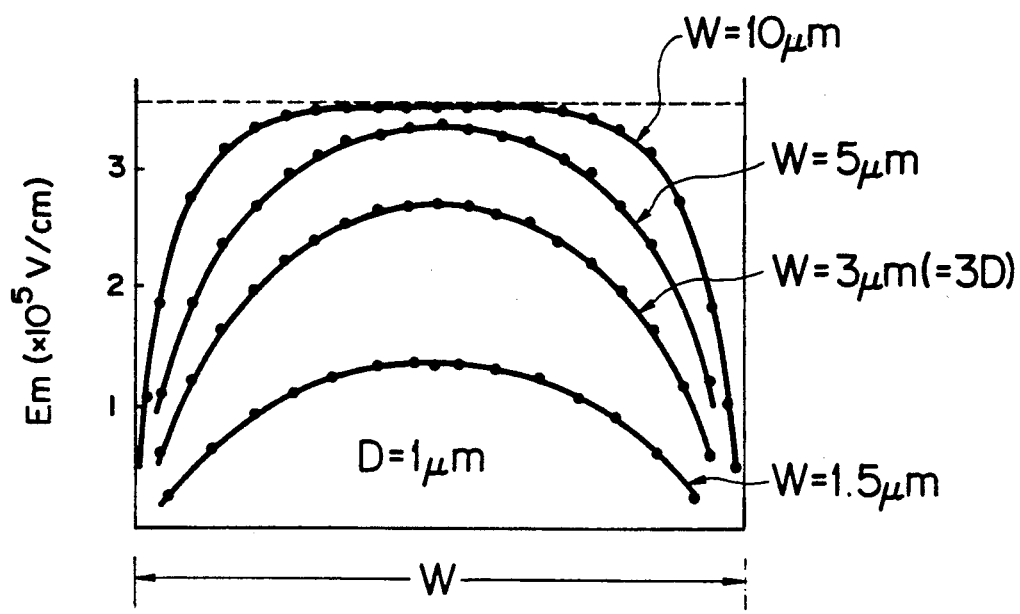
FIG. 3A-3B are graphs showing the relations between W and Em, $J_R$.
Figure 3B:
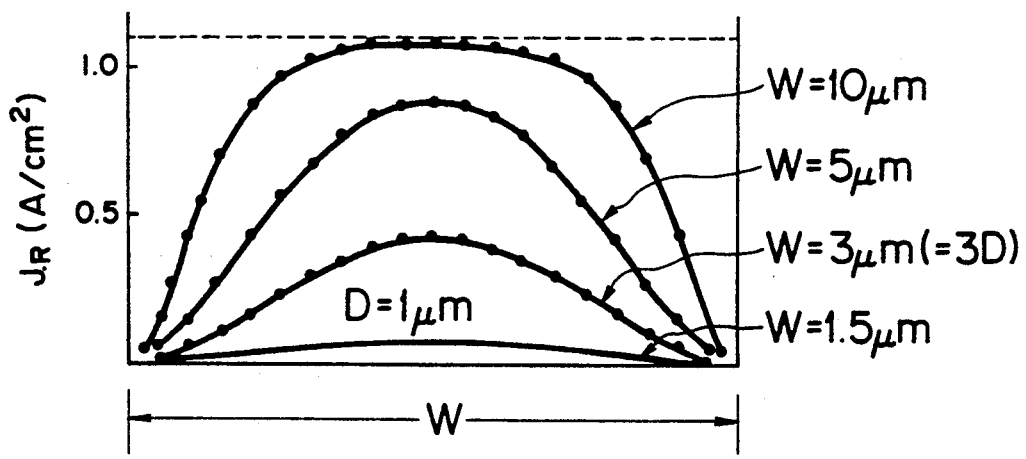

FIGS. 3(A) and (B) show the change of the electric field strength Em and the reverse leakage current density $J_R$ at each position of the Schottky junction with the distance W between the third semiconductor regions 15 used as a parameter in which case the depth D of the third semiconductor regions 15 is 1 μm, the depth of the first semiconductor region 13 is 2.5 μm, the impurity concentration is $1 \times 10^{16}$ atoms/cm$^3$, the first main electrode is made of vanadium, and the reverse biasing voltage is 40 V. From these figures, it will be seen that when W is 10D, the electric field strength is $3.5 \times 10^5$V/cm over a wide range, that when W is 5D, the peak value of the electric field strength is near $3.5 \times 10^5$, and that when W is 3D, the peak value of the electric field strength is $2.7 \times 10^5$V/cm, or about a 20% reduction. Meanwhile, when W is 10D, the reverse leakage current density $J_R$ is 1.1A/cm$^2$, when W is 3D, the peak value thereof is 0.9A/cm$^2$, and when W is 3D, the peak value thereof is 0.4A/cm$^2$, or about a 50% or above reduction. The reason for the sudden reduction of the electric field strength Em from a certain value when W is decreased seems to be that the equipotential lines along the pn junction and the Schottky junction are pulled toward the equipotential line side along the pn junction not to be along the Schottky junction, when W is decreased. Moreover, the reason for the reduction of the reverse leakage current in proportion to the exponential function of the electric field can be understood from the above equation (1).

Figure 4:
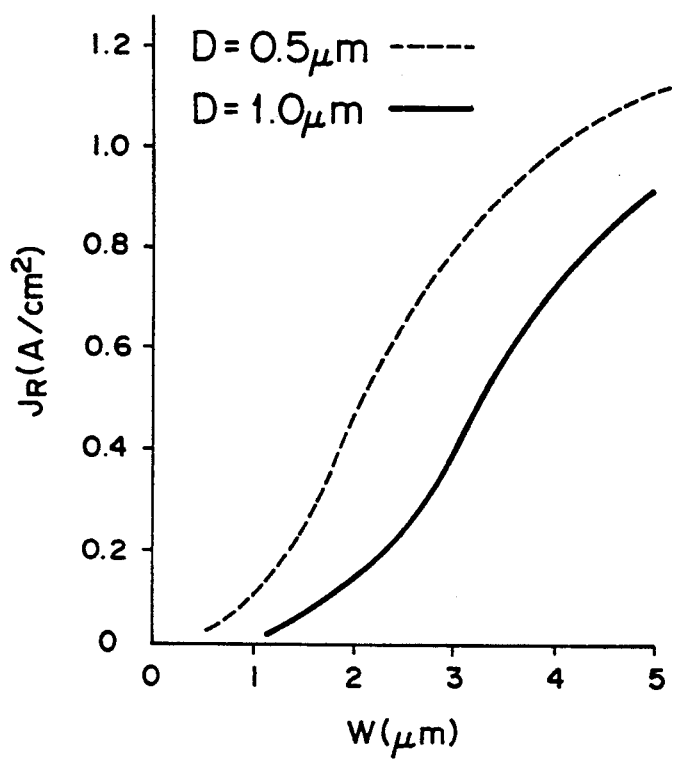
FIG. 4 is a graph showing the relation between W and $J_R$.

FIG. 4 shows the relation between the width W of the Schottky junction and the leakage current density at the center thereof with the depth D of the third semiconductor region 15 used as a parameter in a case in which the first main electrode is made of vanadium, the impurity concentration of the first semiconductor region is $1 \times 10^{16}$ atoms/cm$^3$, and the reverse biasing voltage is 40V. From FIG. 4, it will be seen that the leakage current is considerably reduced when $W \leq 3D$.

On the other hand, in the forward biased condition shown in FIG. 2(B), the depletion layer 52 is spread by a width wo to the first semiconductor region 13 side by the diffusion potential of the pn junction J, and thus W-2wo of the width W of the Schottky junction contributes to the forward current flow. Thus, as the width W approaches 2wo, the path for the forward current becomes gradually narrow to increase the forward voltage drop $V_F$. When W=2wo, the current path for the forward current theoretically disappears, and the forward voltage drop suddenly increases.

Figure 5:
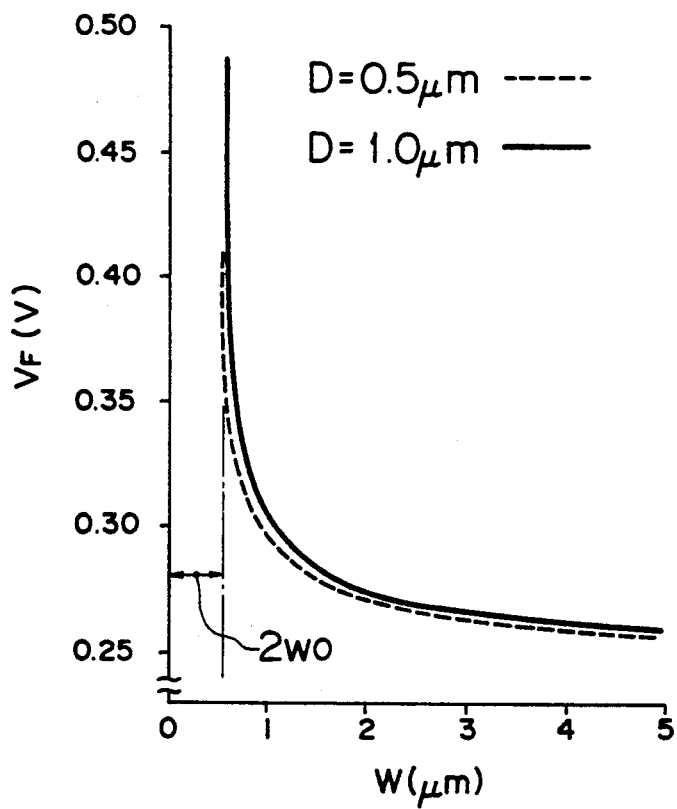
FIG. 5 is a graph showing the relation between W and $V_F$.

FIG. 5 shows the relation between the width W of the Schottky junction and the forward voltage drop $V_F$ when the forward current density $J_F$ is 60A/cm$^2$, the depth D of the third semiconductor region 15 is changed, the first main electrode is made of vanadium and the impurity concentration of the first semiconductor region is $1 \times 10^{16}$ atoms/cm$^3$. From FIG. 5, it will be understood that when W>2wo, the forward voltage drop $V_F$ can be decreased. The width wo is 0.34 $\mu$ when the impurity concentration of the first semiconductor region 13 is $1 \times 10^{16}$ atoms/cm$^3$ and the impurity concentration the third semiconductor region 15 is $1 \times 10^{19}$ atoms/cm$^3$. This value of the width is compensated by the voltage drop to somewhat decrease when the forward current flows.

Figure 6:
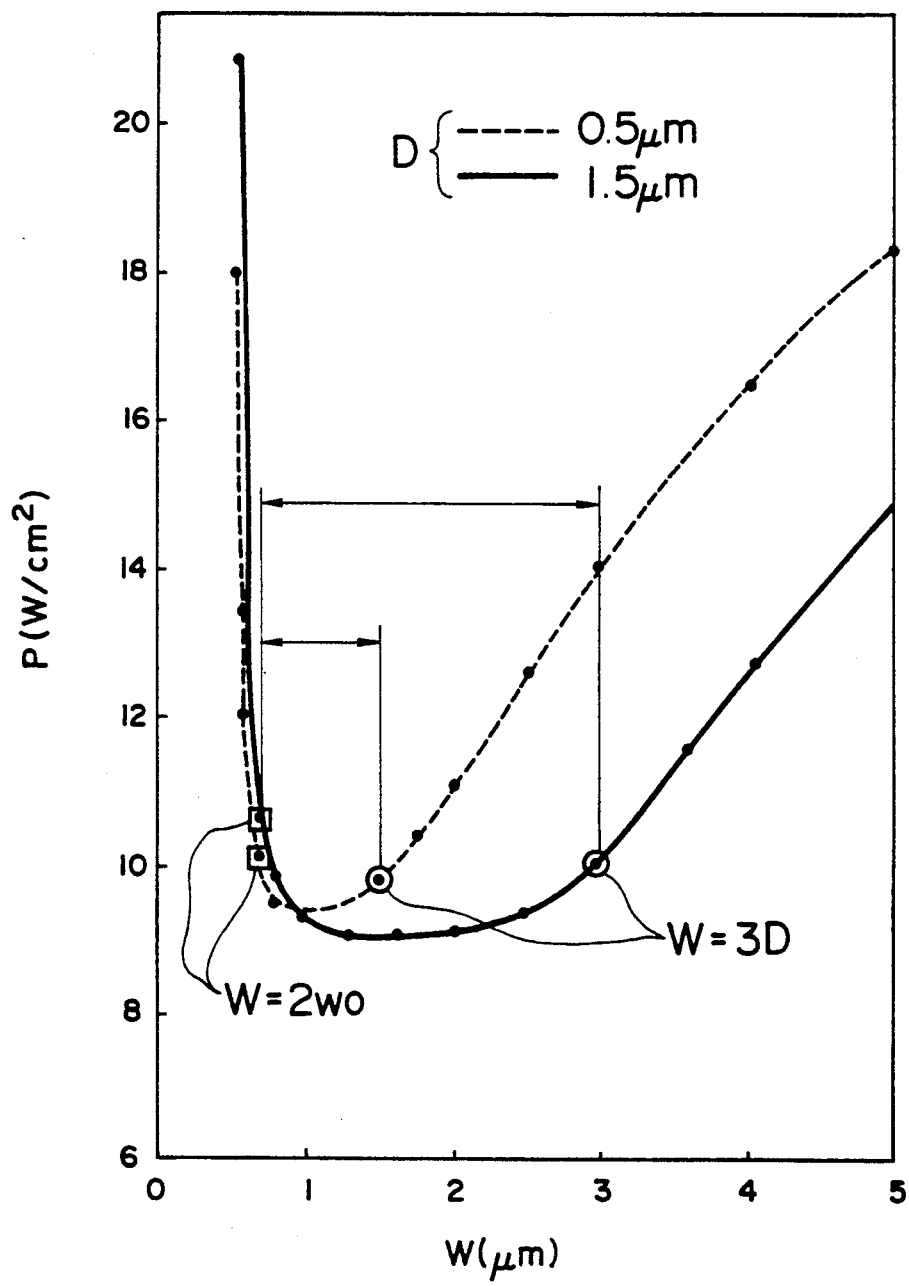
FIG. 6 is a graph showing the relation between W and P.

FIG. 6 shows the relation between the power loss P (W/cm$^2$) per unit area and the width W of the Schottky junction which relation is computed on the basis of the results shown in FIGS. 4 and 5. From FIG. 6, it will be understood that when $2wo < W \leq 3D$, the loss is considerably reduced.

As will be understood from the above description, the structure shown in FIG. 1 can realize a low-loss semiconductor rectifying diode. According to this invention, in addition to the loss reducing effect, it is possible to realize the characteristic corresponding to an arbitrary barrier height even if the first main electrode 2 is made of a material having a particular barrier height. This fact will be mentioned with reference to FIG. 7.

Figure 7:
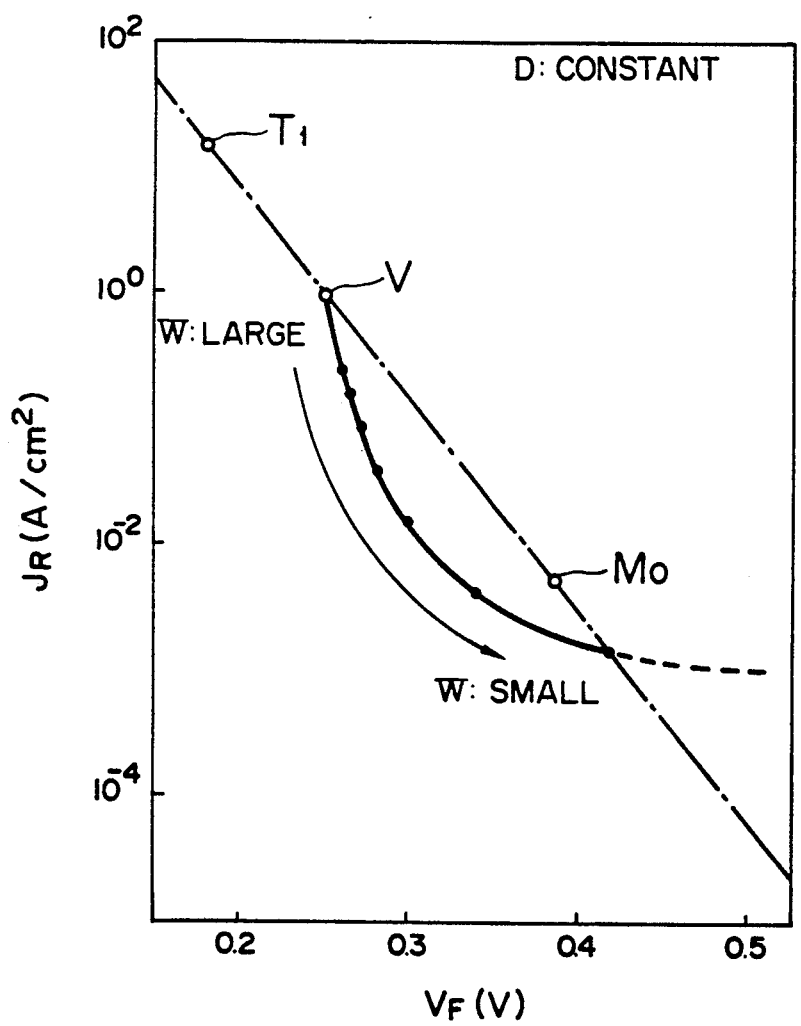
FIG. 7 is a graph showing the relation between $V_F$ and $J_R$.

FIG. 7 shows the relation between the forward voltage drop $V_F$ of the Schottky junction diode obtained by changing the material of the first main electrode 2 and the reverse leakage current density $J_R$ thereof. In FIG. 7, the one-dot chain line indicates the line connecting the characteristic points obtained by a single material, and the small circles ◯ on this line indicate the characteristics obtained by using Ti, V and Mo, respectively. When the mutual characteristic between the characteristics indicated by ◯ is required, two kinds of material lying on both sides of a desired characteristic are combined in the prior art. In this conventional method, the characteristic value moves along the one-dot chain line, and thus the trade-off of the forward voltage and the leakage current density cannot be improved. On the contrary, if the width of the Schottky junction is changed by providing the third semiconductor region as in this invention, the characteristic can be changed continuously as indicated by the solid line in FIG. 7.

Also, as compared with the characteristics obtained by the prior art the reverse leakage current can be reduced if the forward voltage drop is assumed to be the same, and the forward voltage drop can be reduced if the reverse leakage current is assumed to be the same, so that excellent characteristics can be obtained.

While the fourth semiconductor region 16 in FIG. 1 functions as the guard ring, the width of the Schottky junction existing between the third semiconductor regions 15 may be formed in accordance with the object of this invention.

Figure 8:
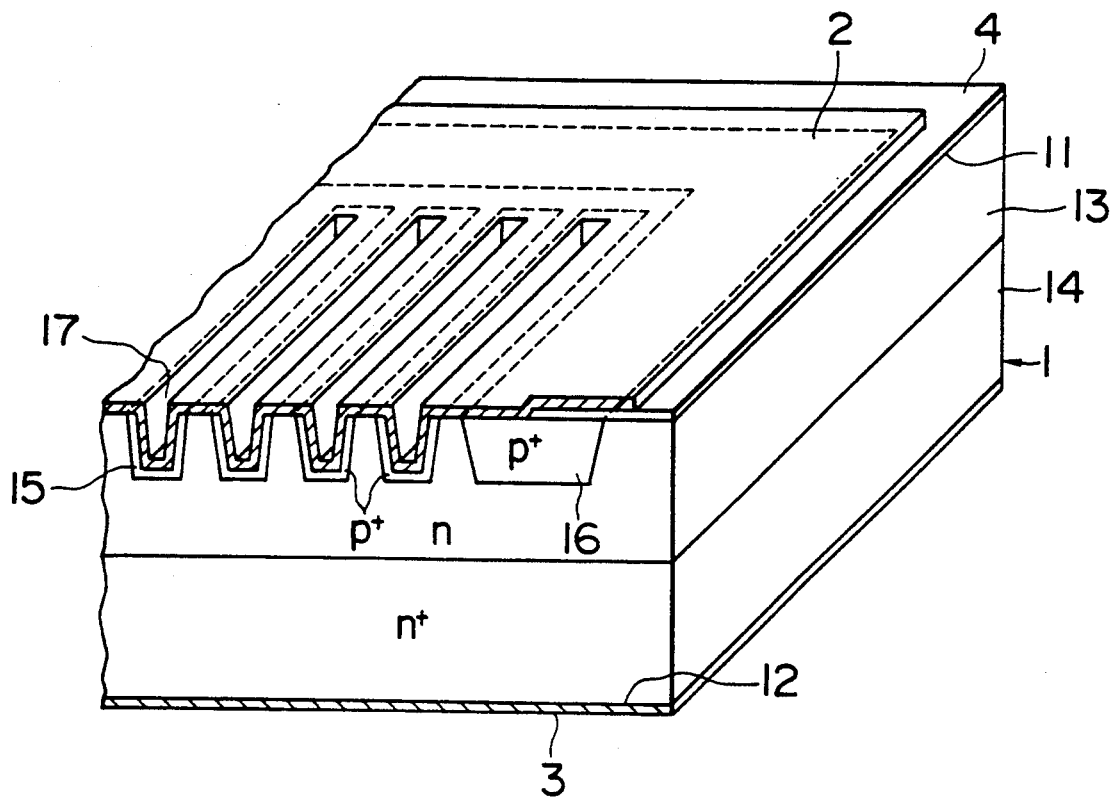
FIGS. 8, 9, 10A, 10B, 11A-E and 12A-C are schematic diagrams of other embodiments of a semiconductor rectifying diode of the invention.

FIG. 8 shows another embodiment of this invention. This embodiment is different from the embodiment shown in FIG. 1 in that recesses 17 are formed on the one main surface 11 under which the third semiconductor regions 15 are formed. The third semiconductor regions 15, after a desired number of recesses 17 are formed on the one main surface 11 of the semiconductor substrate 1, can be formed by diffusing a p-type impurity material from the surfaces of the recesses 17 into the substrate. As compared with the process of forming the third semiconductor regions 15 by diffusion shown in FIG. 1, this method is able to considerably reduce the proportion of the third semiconductor regions 15 occupying the one main surface 11 which proportion does not contribute to the forward current flow, thus enabling the chip size to be small.

Figure 9:
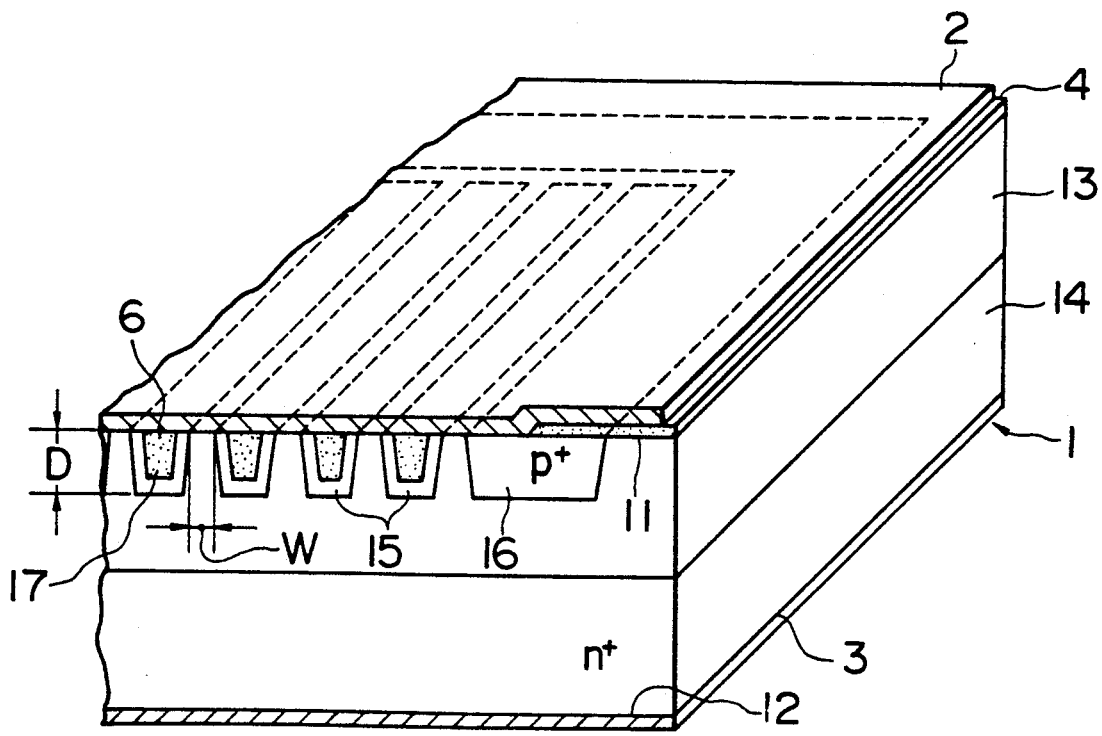

FIG. 9 shows still another embodiment of the invention. This embodiment is different from the embodiment shown in FIG. 8 in that a conductive material 6 is buried within the recesses 17. The conductive material 6 may be polysilicon or metal. According to the embodiment, since the one main surface 11 is flat, the first main electrode 2 has smaller possibility of the breakage than the embodiment shown in FIG. 8.

Figure 10A:
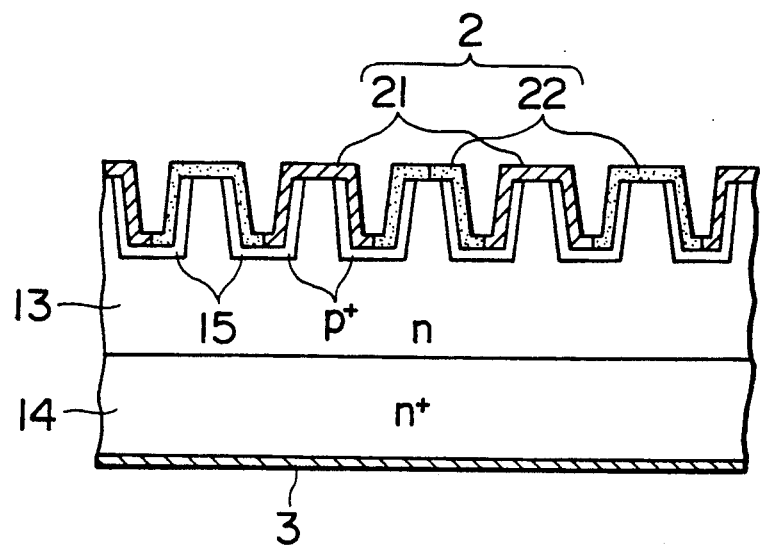
Figure 10B:
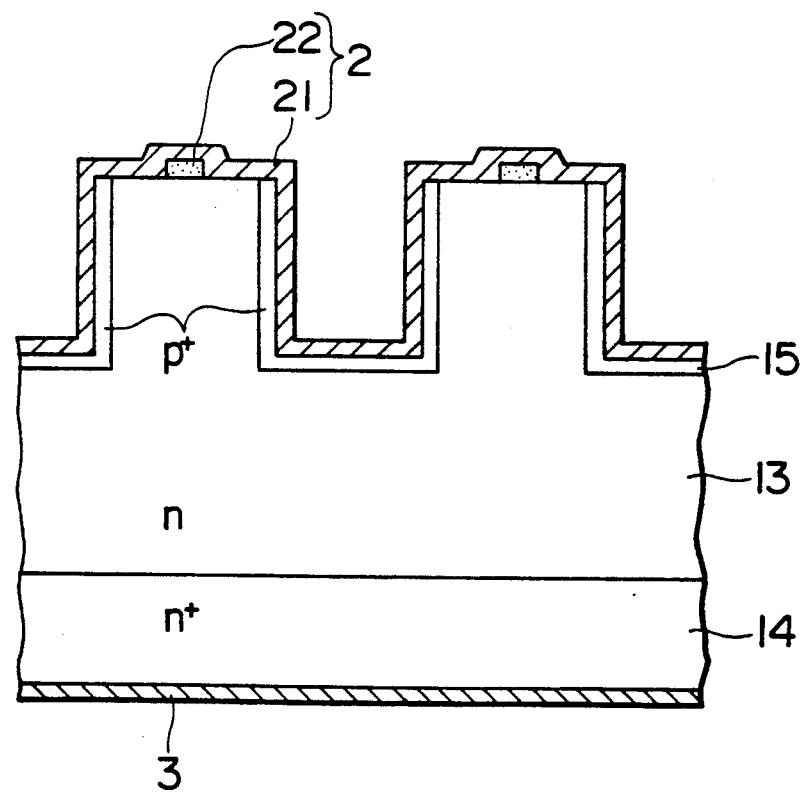

FIG. 10A and 10B show further embodiments of this invention, in which the first main electrode 2 is made of materials 21, 22 of different barrier heights. Examples of the materials 21 and 22 with different barrier heights are Mo and Ti. The materials are combined in different ways; for example, (a) the materials 21 and 22 are alternately arranged, and (b) the material 22 is partially provided and the material 21 is provided over the entire area including the partially provided material 22. As compared with the case in which a single material is used, this embodiment can easily obtain a desired characteristic, particularly the optimum forward voltage drop.

Figure 11A:
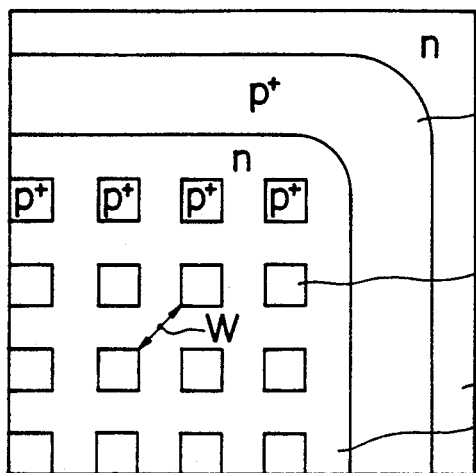
Figure 11B:
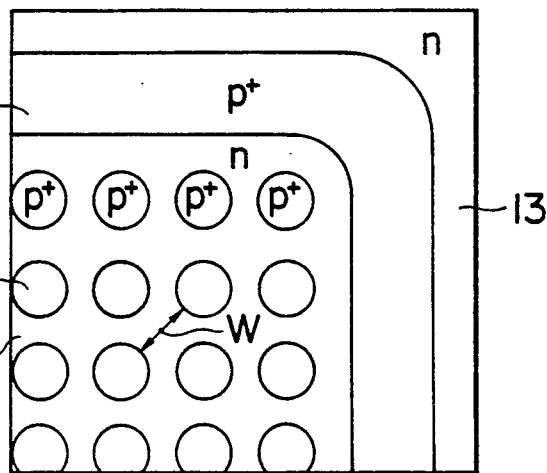
Figure 11C:
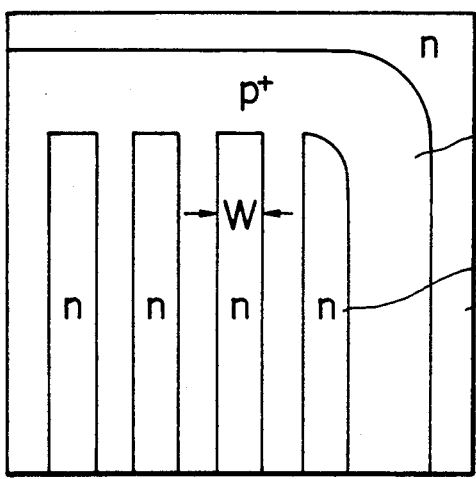
Figure 11D:
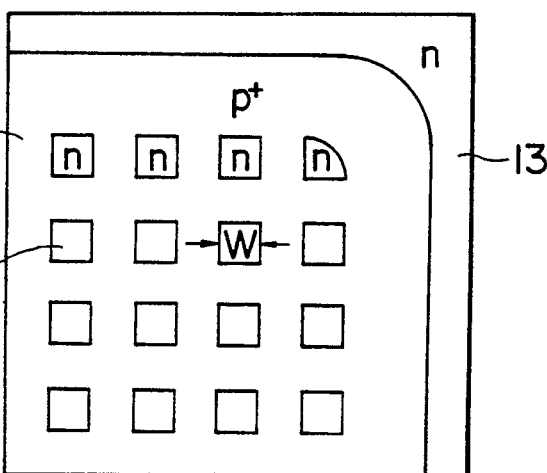
Figure 11E:
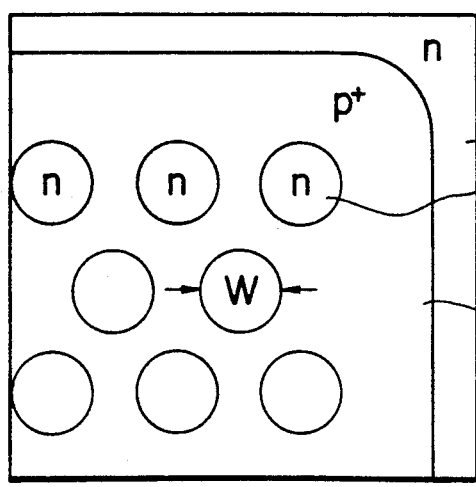

FIG. 11A to 11E are pattern diagrams of the one main surface 11 of further embodiments of this invention. FIGS. 11A and 11B show a large number of rectangular and circular third semiconductor regions 15, respectively. The third semiconductor regions 15 of these shapes have the advantage that the current flow area can be increased as compared with that of the stripe shapes. FIGS. 11C to 11E show the constructions in which the third semiconductor regions 15 are formed entirely over the one main surface and a great number of cutouts of stripe, rectangular and circular shapes are provided in the uniform third semiconductor region to expose the first semiconductor region 13 thereunder.

Figure 12A:
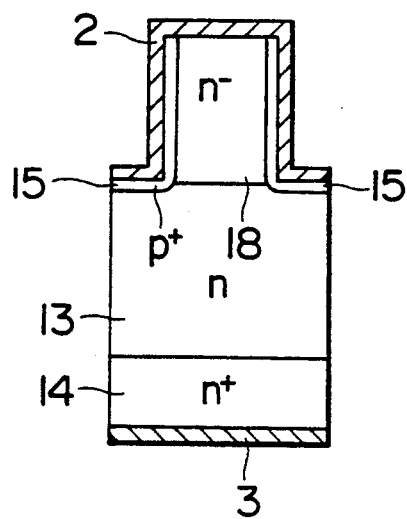
Figure 12B:
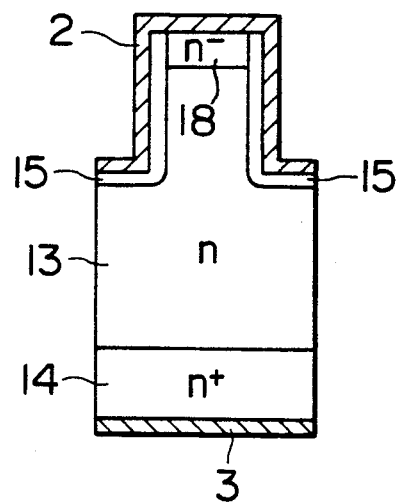
Figure 12C:
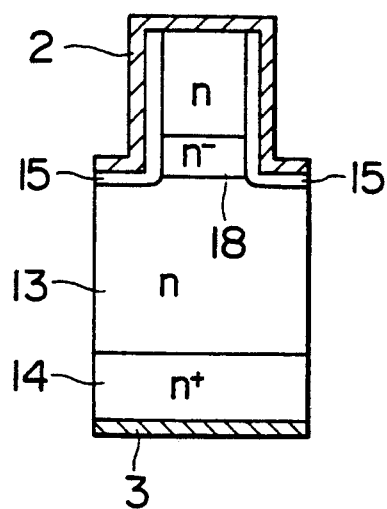

FIGS. 12A to 12C show a still further embodiment of this invention. This embodiment is different from the above-given embodiments in that a fifth semiconductor region 18 or n$^-$-type adjacent to the first semiconductor region 13 and having a lower impurity concentration than the first semiconductor region is provided between the third semiconductor regions 15. The fifth semiconductor regions 18 have the advantage that the depletion layer is more easy to extend than the first semiconductor regions 15 so that the reverse leakage current can be further decreased. FIG. 12(A) shows the case in which the fifth semiconductor region 18 is provided in the entire region between the third semiconductor regions 15, FIG. 12(B) shows the case in which the fifth semiconductor region 18 is provided only in the region adjacent to the Schottky junction, and FIG. 12(C) shows the case in which the fifth semiconductor region 18 is provided in a region separated from the Schottky junction. The structure shown in FIG. 12(A) has the effect to further reduce the electric field strength at the Schottky junction, while the structures shown in FIGS. 12(B) and (C) have the effect of reducing the forward voltage drop to a greater degree than the structure shown in FIG. 12(A).

While typical embodiments of a semiconductor rectifying diode of the invention have been described above, this invention is not limited to these embodiments, but can take other various different structures without departing from the scope of the technical idea of the invention.

If the semiconductor rectifying diode of the invention is applied to a power supply and a computer having that power supply, these power supply and the computer can be constructed to have a small size, light weight and high efficiency, as described below.

Figure 13:
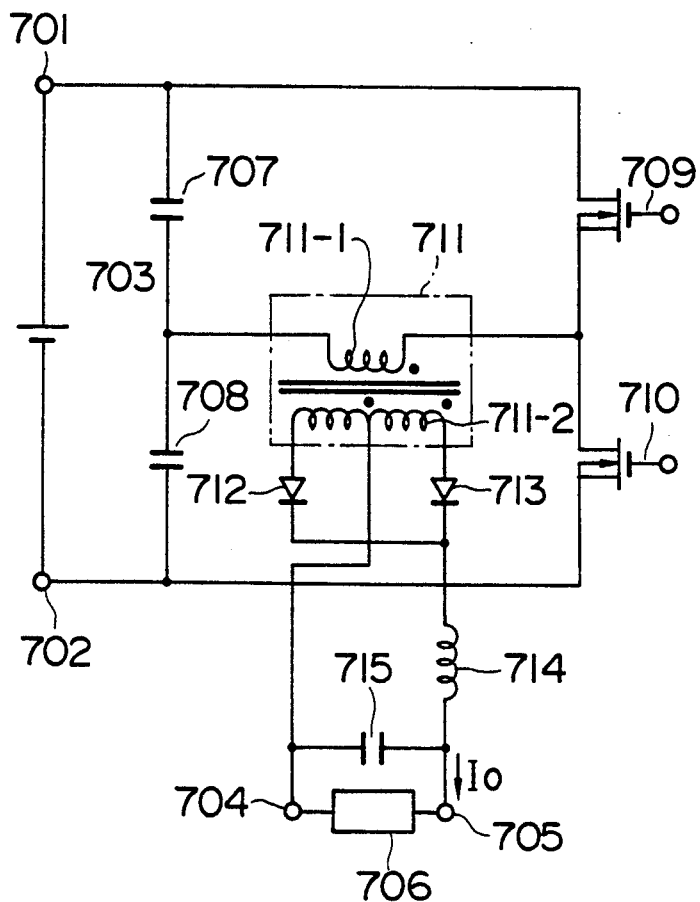
FIG. 13 is a circuit diagram of one example of a power supply using the semiconductor rectifying diode of this invention.

FIG. 13 shows the circuit arrangement of a DC-DC converter of an example of a power supply using semiconductor rectifying diodes of this invention. The DC-DC converter is a switching power supply by which an input DC power is converted into an output DC power for the DC voltage to be stably supplied to a load such as electronic equipment. The DC-DC converter shown is of the half bridge type. In FIG. 13, there are shown a pair of input terminals 701, 702 between which a DC power supply 703 is connected, a pair of output terminals 704, 705 between which a load 706 is connected, a series circuit of first and second source voltage dividing capacitors 707, 708 which is connected between the input terminals 701, 702, a series circuit of first and second switching elements 709, 710 which is connected between the input terminals 701, 702 and which alternately perform a switching operation, and a transformer 711 with its primary winding, 711-1 connected between the connection point of the first and second voltage dividing capacitors 707, 708 and the connection point between the first and second switching elements 709, 710, and with the mid point of its secondary winding, 711-2 connected to the output terminal 704. Moreover, there are shown first and second diodes 712, 713 of which the anodes are connected to the ends of the secondary winding 711-2 and of which the cathodes are connected through a smoothing reactor 714 to the output terminal 705, and a smoothing capacitor 715 which is connected between the output terminals 704 and 705. In this DC-DC converter, the on-period of the first and second switching elements 709, 710 which are alternately turned on is changed by the pulse width modulation (PWM) so that the output voltage to the load 706 is controlled to be constant against the variation of the input voltage or load current.

In this DC-DC converter, the power loss, Pd occurring in the first and second diodes 712 and 713 is given by the following equation (2):

$$P_d = V_F I_O + 2I_R V_1 \frac{N_2}{N_1} D_{uty} \quad (2)$$

where, $V_F$: on-voltage of diode
$I_O$: load current
$I_R$: reverse leakage current of diode
$V_1$: voltage across dividing capacitor 707, 708
$N_1$: number of turns of primary winding of transformer
$N_2$: number of turns of secondary winding of transformer
$D_{uty}$: ratio of on-times of switching elements 709, 710

In Eq. (2), the first term is the power loss due to the forward current, and the second term is the power loss due to the reverse current. In order to adjust the output voltage to be constant against the fluctuation of the input voltage V1, it is necessary to control the $D_{uty}$ to satisfy Eq. (3).

$$V_O + V_F = V_1 \frac{N_2}{N_1} D_{uty} \quad (3)$$

where $V_O$: output voltage

Substituting Eq. (3) into Eq. (2) for elimination of the $V_1 D_{uty}$ product term will yield Eq. (4).

$$P_d = V_F V_O + 2I_R(V_O + V_F) \ldots \quad (4)$$

By the way, the diode having the Schottky junction can be obtained in a series form having the combination of $V_F$ and $I_R$ specified by the following equation (5).

$$I_n I_R = a(V_F + b) \ldots \quad (5)$$

a: negative constant parameter
b: constant parameter

If the output voltage Vo and load current Io are determined by the specification of the DC-DC converter, the series-formed diodes include a diode having the minimum power loss expressed by Eq. (4). Using this diode it is possible to construct a DC-DC converter of small size, light weight and high efficiency. The semiconductor rectifying diode of this invention is improved to have smaller b in Eq. (5). By use of such diodes in the DC-DC converter, it is possible to further reduce the power loss in the diodes.

For the convenience of explanation it is assumed that most of the power loss Pd is due to the forward current and that the circuit loss is caused only in the rectifying diodes. The power loss Pd in the rectifying diodes and the efficiency $\eta$ are respectively given by the following equations (6) and (7):

$$P_d \approx V_F I_O \quad (6)$$

$$\eta \approx \frac{V_O I_O}{V_O I_O + V_F I_O} = \frac{1}{1 + V_F/I_O} \quad (7)$$

Here, a DC-DC converter of 3V, 600A is considered which produces an output voltage of as low as 5V and a large current. Moreover, it is assumed that by this invention the barrier metal and its shape are selected to be optimum and that $V_F$ can be reduced from the previous 0.55V to 0.35V. In this case, the loss and efficiency in the use of the conventional semiconductor rectifying diodes and those of the invention are as follows.

1) In the use of the conventional diodes, power loss = 330W, efficiency 84.5%

2) In the use of the diodes of the invention, power loss = 210W, efficiency 89.6%

Generally, in the low-voltage large-current output DC-DC converter, since the bottom area of a parallelepiped is determined by the cooling fin for radiating the heat generated in the rectifying diodes, its volume is approximately proportional to the power loss. Thus, if the semiconductor rectifying diode of the invention is used for the diode on the secondary side of the DC-DC converter, the volume can be reduced 36% and the efficiency is improved 5%, so that it is possible to construct the DC-DC converter to have a small size, light weight and high efficiency. This effect becomes greater as the output becomes lower in voltage and larger in current. Moreover, this effect occurs even in the DC-DC converter of low voltage, large current output other than the half bridge type shown in FIG. 13.

Figure 14:
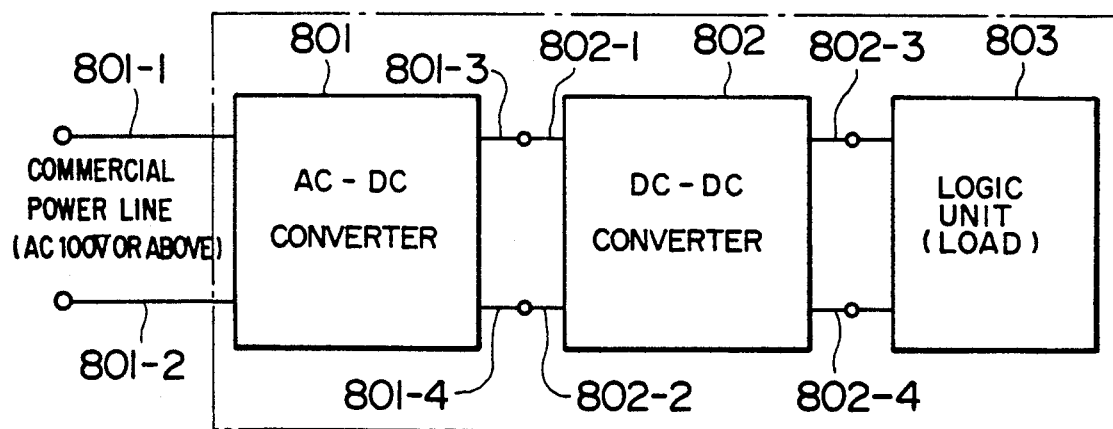
FIG. 14 is a block diagram of one example of a computer using the power supply shown in FIG. 13.

FIG. 14 shows the circuit arrangement of an example of a computer using the DC-DC converter shown in FIG. 13 as part of the power supply. A typical example of the application of the DC-DC converter of low-voltage, large-current output is the computer. The computer includes an AC-DC converter 801 having input terminals 801-1, 801-2 and output terminals 801-3, 801-4 and of which the input terminals 801-1 and 801-2 are connected to a commercial power supply, a DC-DC converter 802 having input terminals 802-1, 802-2 and output terminals 802-3, 802-4 and of which the input terminals 802-1, 802-2 are connected to the output terminals 801-3, 801-4 of the AC-DC converter 801, and a logical unit 803 connected to the output terminals 802-3, 802-4 of the DC-DC converter 802. The AC-DC converter 801 may be a simple type comprising a rectifying circuit of diode bridge and a smoothing circuit, or another type comprising a rectifying circuit of a thyristor bridge for phase control and a smoothing circuit. The DC-DC converter 802 may be the converter shown in FIG. 13 by which the computer can be constructed to have a small size, light weight and high efficiency.

As described above, the semiconductor rectifying diode of the invention can be improved in the trade-off of the diode characteristics expressed by the forward voltage drop and the reverse leakage current density so that the excellent characteristic of small power loss can be realized.

We claim:

1. A semiconductor rectifying diode comprising:
a semiconductor substrate having a pair of main surfaces, a first semiconductor region of a first conductivity type provided between said pair of main surfaces and adjacent to one main surface of said pair of main surfaces, a second semiconductor region of said first conductivity type provided adjacent to the other main surface of said pair of main surfaces and to said first semiconductor region, said second semiconductor region having a higher impurity concentration than said first semiconductor region, and a third semiconductor region of a second conductivity type provided to extend from said one main surface into said first semiconductor region, the first semiconductor region penetrating the third semiconductor region and being exposed at a plurality of portions of said one main surface, wherein said exposed portions, surrounded by the third semiconductor regions, each have substantially the same size at said one main surface;
a first main electrode provided on said one main surface of said semiconductor substrate to form Schottky junctions with the exposed portions of said first semiconductor region, and to be in ohmic contact with said third semiconductor region; and
a second main electrode provided on said other main surface of said semiconductor substrate to be in ohmic contact with said second semiconductor region;
wherein a relation of $2w_o < W \leq 3D$ is satisfied, where W is the width of said exposed portions of said first semiconductor region, D is the depth of said third semiconductor region, and $w_o$ is the width of a depletion layer spread to said first semiconductor region side by a diffusion potential of a pn junction formed between said first semiconductor region and said third semiconductor region when said semiconductor rectifying diode is in a predetermined forward biased condition, and
wherein said third semiconductor region has recesses provided open to said one main surface, and the surfaces of said recesses are separated from the pn junction formed between said first semiconductor region and said third semiconductor region.

2. A semiconductor rectifying diode according to claim 1, wherein said third semiconductor region has stripe portions disposed in parallel and spaced substantially an equal distance from each other, and a coupling portion provided on the opposite-ends of said stripe portions as viewed in their longitudinal direction to couple said stripe portions with each other.

3. A semiconductor rectifying diode according to claim 1, wherein portions of said third semiconductor region, exposed at said one main surface between said exposed portions of said first semiconductor region, has a polygonal shape as viewed from said one main surface side.

4. A semiconductor rectifying diode according to claim 1, wherein said first main electrode is made of a plurality of metals with different barrier heights in the interface between said first main electrode and said semiconductor substrate.

5. A semiconductor rectifying diode comprising:
a semiconductor substrate having a pair of main surfaces, a first semiconductor region of a first conductivity type provided between said pair of main surfaces and adjacent to one main surface of said pair of main surfaces, a second semiconductor region of said first conductivity type provided adjacent to the other main surface of said pair of main surfaces and to said first semiconductor region, said second semiconductor region having a higher impurity concentration than said first semiconductor region, and a plurality of third semiconductor regions of a second conductivity type provided to extend from said one main surface into said first semiconductor region and to be spaced substantially a constant distance in parallel with each other as viewed from the one main surface side, and a fourth semiconductor region of the other conductivity provided to extend from said one main surface into said first semiconductor region and to surround said third semiconductor regions apart therefrom as viewed from said one main surface;
a first main electrode provided on said one main surface of said semiconductor substrate to form Schottky junctions with the surfaces of said first semiconductor regions exposed at said one main surface and to be in ohmic contact with said third semiconductor regions and said fourth semiconductor region; and a second main electrode provided on said other main surface of said semiconductor substrate to be in ohmic contact with said second semiconductor region;

wherein a relation of $2w_o < W \leq 3D$ is satisfied, where W is the width between said third semiconductor regions and is also the width between said third semiconductor region and said fourth semiconductor region, D is the depth of said third semiconductor regions and said fourth semiconductor region, and $w_o$ is the width of a depletion layer spread to said first semiconductor region side by a diffusion potential of pn junctions formed between said first semiconductor region, said third semiconductor regions and said fourth semiconductor region when said semiconductor rectifying diode is in a predetermined forward biased condition, and wherein said third semiconductor regions and said fourth semiconductor region have recesses provided open to said one main surface, and the surfaces of said recesses are separated from the pn junctions formed between said first semiconductor region and said third and fourth semiconductor regions.

6. A semiconductor rectifying diode according to claim 5, wherein said third semiconductor regions have a shape of stripes disposed in parallel with each other and are spaced substantially an equal distance from each other, and wherein the outermost stripe is spaced substantially said equal distance from said fourth semiconductor region.

7. A semiconductor rectifying diode according to claim 5, wherein said third semiconductor regions have a polygonal shape and are spaced substantially an equal distance from each other, and wherein the outer polygons of said third semiconductor regions are spaced said equal distance from said fourth semiconductor region.

8. A semiconductor rectifying diode according to claim 5, wherein said first main electrode is made of a plurality of metals with different barrier heights in the interface between said first main electrode and said semiconductor substrate.

9. A semiconductor rectifying diode according to claim 1, wherein said third semiconductor regions are formed in the first semiconductor region by diffusing impurities into the recesses formed in the first semiconductor region.

10. A semiconductor rectifying diode according to claim 5, wherein said third semiconductor regions are formed in the first semiconductor region by diffusing impurities into the recesses formed in the first semiconductor region.

* * * * *